(12) United States Patent
Nishio et al.

(10) Patent No.: US 6,991,951 B2
(45) Date of Patent: Jan. 31, 2006

(54) SOLID-STATE IMAGING DEVICE PRODUCTION METHOD AND SOLID-STATE IMAGING DEVICE

(75) Inventors: Rieko Nishio, Kyoto (JP); Toshihiro Kuriyama, Otsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/853,129

(22) Filed: May 26, 2004

(65) Prior Publication Data

US 2004/0241893 A1    Dec. 2, 2004

(30) Foreign Application Priority Data

May 27, 2003    (JP)    ............... 2003-149597

(51) Int. Cl.
*H01L 21/00*    (2006.01)

(52) U.S. Cl. ..................... 438/22; 438/38; 257/431

(58) Field of Classification Search .............. 438/22, 438/25, 28, 38, 54, 60, 75; 257/431, 432, 257/440, 462

See application file for complete search history.

(56) References Cited

U.S. PATENT DOCUMENTS 5,221,430 A * 6/1993 Kadomura et al. ........... 216/70
5,747,790 A * 5/1998 Shimomura et al. ...... 250/208.1
6,403,994 B1 * 6/2002 Wada ......................... 257/229
6,635,529 B2 * 10/2003 Inomata ..................... 438/253
6,794,215 B2    9/2004 Park et al.

FOREIGN PATENT DOCUMENTS

| JP | 5-283667 | 10/1993 |
| JP | 2001-267547 | 9/2001 |
| JP | 2002-016134 | 1/2002 |

* cited by examiner

*Primary Examiner*—Phuc T. Dang
(74) *Attorney, Agent, or Firm*—McDermott Will & Emery LLP (57) ABSTRACT

A solid-state imaging device production method is provided. A light-receiving section 12 is formed on a semiconductor substrate 1. A first insulating film 6 is formed on a light-receiving section 12 and the semiconductor substrate 1. A metal film for wiring is formed on the first insulating film 6. A protection film 8 is formed on the metal film. A resist film is formed on a predetermined region of the protection film. A portion of the protection film 8 and a portion of the metal film is removed by using the resist film to form a wire 7 whose upper face is covered by the protection film 8. A hydrogen-containing second insulating film 10 is formed on the wire 7 and the first insulating film 6. A heating process is performed for the second insulating film 10. An anisotropic etching process is performed for the entire surface of the second insulating film 10 to remove the second insulating film 10.

13 Claims, 11 Drawing Sheets

SOLID-STATE IMAGING DEVICE PRODUCTION METHOD AND SOLID-STATE IMAGING DEVICE

BACKGROUND OF THE INVENTION

1. Field of the Invention

The present invention relates to a method for producing a solid-state imaging device.

2. Description of the Background Art

Figure 6:
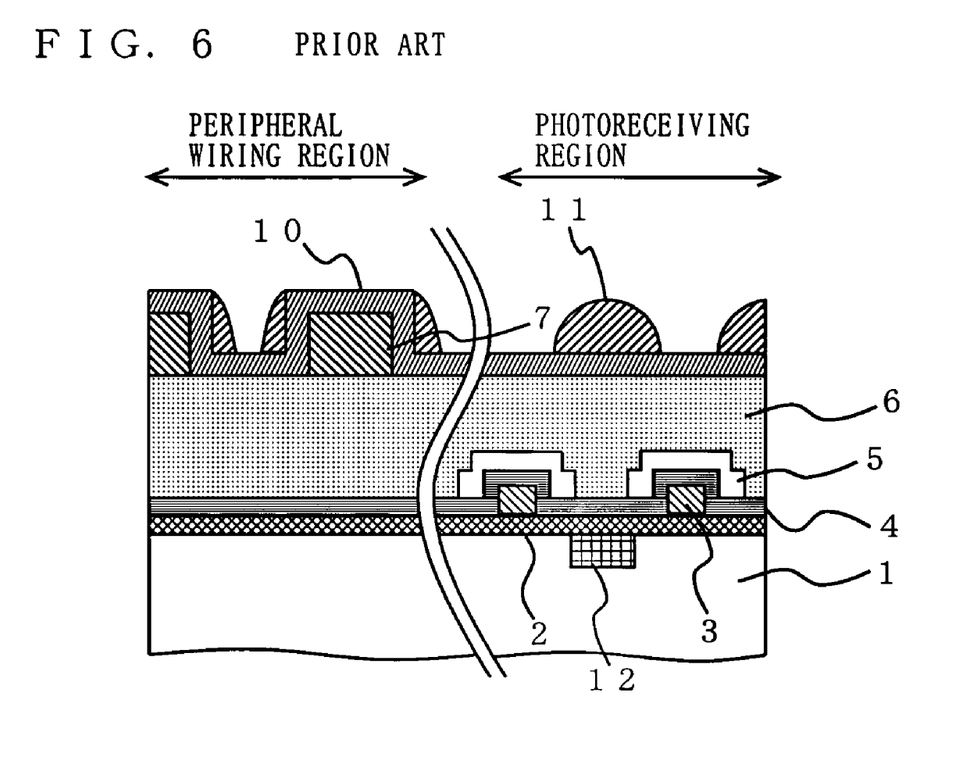
FIG. 6 is a view showing a cross-sectional structure of the solid-state imaging device.

In a solid-state imaging device, it is very important to suppress the occurrence of a dark current near photodiodes, in terms of improving the performance of the solid-state imaging device. Therefore, various methods or devices for suppressing the occurrence of such a dark current have been proposed. Hereinafter, an example of a conventional solid-state imaging device which suppresses the occurrence of a dark current will be described with reference to the figures. FIG. 6 is a view showing a cross-sectional structure of the solid-state imaging device. The right-hand side of FIG. 6 shows a light-receiving region in which photosensitive elements and the like are formed. The left-hand side of FIG. 6 shows a peripheral wiring region in which wiring and the like for the solid-state imaging device are formed.

The solid-state imaging device shown in FIG. 6 comprises a silicon substrate 1, a gate insulating film 2, a transfer electrode 3, an interlayer insulating film 4, a light-shielding film 5, an insulating film 6, a wiring film 7, an insulating film 10, a microlens 11, and a photodiode (hereinafter abbreviated as "PDs") 12. The solid-state imaging device is produced through steps described below.

First, a PD 12, which is a photosensitive element, is formed on the silicon substrate 1. Next, on the silicon substrate 1, a CCD circuit light-receiving section is formed which is composed of: the gate insulating film 2 (e.g., a silicon oxide film), the transfer electrode 3 (e.g., polysilicon), the interlayer insulating film 4 (e.g., a silicon oxide film), the light-shielding film 5 (e.g., W(tungsten)), and the like. Thereafter, the insulating film 6 (e.g., a silicon oxide film) for providing insulation between a lower layer wiring (not shown) and the wiring film 7 is deposited. On the insulating film 6, the wiring film 7 (e.g., Al (aluminum)) is formed by a photolithography technique using a resist film.

Once the formation of the wiring film 7 is completed, the insulating film 10 (e.g., silicon nitride film), which contains plenty of N(nitrogen)-H(hydrogen) bonds, is formed on the insulating film 6 and the wiring film 7 by a plasma CVD (Chemical Vapor Deposition) technique. Thereafter, a heating process is performed for the solid-state imaging device at 300° C. to 450° C. for several minutes or several hours. Due to the formation of the insulating film 10 and the heating process, the dark current is reduced. Hereinafter, the reason why the heating process reduces the dark current will be described in detail.

A dark current occurs due to, for example, an interface state occurring at an interface between the silicon substrate 1 and the gate insulating film 2, which is a silicon oxide film. The interface state causing the dark current is ascribable to the presence of unaccomplished bonds (hereinafter referred to as "dangling bonds") of silicon atoms existing at an interface between the silicon substrate 1 and the gate insulating film 2, which is a silicon oxide film. In other words, it is possible to suppress the occurrence of a dark current by reducing the number of dangling bonds.

Therefore, in the conventional solid-state imaging device above, hydrogen atoms are bound to dangling bonds of silicon atoms in order to reduce dangling bonds, thus reducing the interface state. Specifically, after depositing the insulating film 10, which is a silicon nitride film containing N—H bonds, a heating process is performed in order to allow the hydrogen atoms contained in the insulating film 10 to diffuse into the solid-state imaging device. The hydrogen atoms diffusing into the solid-state imaging device will pass through the insulating film 6 and the like, and arrive at the interface between the silicon substrate 1 and the gate insulating film 2. Then, the hydrogen atoms bind to the dangling bonds present at the interface between the silicon substrate 1 and the gate insulating film 2. As a result, the interface state occurring at the interface between the silicon substrate 1 and the gate insulating film 2 can be reduced, whereby the occurrence of a dark current can be suppressed (see, for example, FIG. 6 of Japanese Laid-Open Patent Publication No. 5-283667).

The silicon nitride film which has been formed through a plasma CVD technique used for the insulating film 10 has a higher optical absorption rate than does any other insulating film. Therefore, if the insulating film 10 is present below the microlens 11, the amount of light reaching the PD 12 will be reduced, thus deteriorating the sensitivity characteristics of the solid-state imaging device. Therefore, from the standpoint of improving the sensitivity of the solid-state imaging device, it is preferable to remove the insulating film 10 through an etching process, after performing the aforementioned heating process.

In order to remove the insulating film 10 through an etching process, it is necessary to perform the etching process after providing a mask on the wiring layer 7. The reason is that the wiring layer 7 would be damaged if the wiring layer 7 were directly exposed to an etching process.

However, forming a mask in the region of the wiring layer 7 would require a large number of complicated steps, such as application of a photoresist, an exposure, and a development. Thus, the fact that a mask for protecting the wiring layer 7 is needed during a step for removing the insulating film 10 implies an increase in the number of steps for producing the solid-state imaging device.

SUMMARY OF THE INVENTION

Therefore, an object of the present invention is to provide a solid-state imaging device production method which can improve the sensitivity of a solid-state imaging device while suppressing the occurrence of a dark current, and which can easily produce a solid-state imaging device whose wiring has not been damaged from an etching process.

According to the present invention: a light-receiving section is formed on a semiconductor substrate; a first insulating film is formed on the light-receiving section and the semiconductor substrate; a metal film for wiring is formed on the first insulating film; a protection film is formed on the metal film; a resist film is formed on a predetermined region of the protection film; a portion of the protection film and a portion of the metal film are removed by using the resist film to form a wire whose upper face is covered by the protection film; a hydrogen-containing second insulating film is formed on the wire and the first insulating film; a heating process is performed for the second insulating film; and an anisotropic etching process is performed for an entire surface of the second insulating film to remove the second insulating film. By forming a solid-state imaging device through such steps, it becomes possible to use a common resist film for both the formation of the wire and the formation of a protection film for protecting the wire. As a result, the number of times of forming resist films can be reduced, thus facilitating the production of the solid-state imaging device.

The step of forming the wire may comprise etching away the metal film and the protection film by using the resist film as a mask; and removing the resist film. Thus, it becomes possible to selectively remove the metal film and the protection film through a single etching process.

Alternatively, the step of forming the wire may comprise: etching away the protection film by using the resist film as a mask; removing the resist film; and etching away the metal film by using the protection film as a mask. Thus, by performing removal of the metal film and removal of the protection film in two steps, it becomes possible to perform an etching process under optimum conditions for each film. As a result, wiring can be formed with a higher precision.

After etching away the second insulating film, a lens may be formed on the first insulating film for collecting light to the light-receiving section. By thus forming a lens, it becomes possible to collect light at the light-receiving section more efficiently.

After the heating process, a resist film may be formed between said wires, and the step of removing the second insulating film may comprise performing an anisotropic etching process using the resist film formed between the wires as a mask, and a step of depositing an insulating film between the wires may be performed. By thus filling the gap between wires with the insulating film, the level difference between wires is reduced, thereby making it easier to form films and resist films on the wires.

Preferably, the second insulating film is a silicon nitride film formed by a plasma CVD technique. A silicon nitride film which is formed by a plasma CVD technique contains plenty of N—H bonds. Therefore, during a heating process, a large amount of hydrogen atoms are diffused into the solid state imaging device, so as to be bound to the interface state occurring in the solid-state imaging device. As a result, the occurrence of a dark current in the solid-state imaging device can be suppressed.

According to another aspect of the present invention, a light-receiving section is formed on a semiconductor substrate; a first insulating film is formed on the light-receiving section and the semiconductor substrate; a wire is formed on the first insulating film; a protection film is formed on the wire and the first insulating film; a hydrogen-containing second insulating film is formed on the protection film; a heating process is performed for the second insulating film; and an etching process is performed to remove the second insulating film. The protection film has a higher optical transmittance than that of the second insulating film. Since the protection film has a high optical transmittance, it will not hinder entrance of light into the light-receiving section even if formed on the entire surface of the solid-state imaging device. Therefore, it is unnecessary to remove the protection film formed on the light-receiving section. By forming a solid-state imaging device through such steps, the only resist film to be formed is that used for the wire formation. As a result, the number of times of forming resist films can be reduced, thus facilitating the production of the solid-state imaging device.

The etching process may be an anisotropic etching process or an isotropic etching process. In the case where the etching process is an isotropic etching process, it is possible to completely remove the second insulating film.

The present invention is directed not only to solid-state imaging device production methods but also to a solid-state imaging device which is produced by the production methods.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Hereinafter, a solid-state imaging device production method according to a first embodiment of the present invention will be described with reference to the figures. In the solid-state imaging device production method according to the present embodiment, an insulating film of plasma silicon nitride is formed and a heating process is performed in order to reduce a dark current, and the insulating film of plasma silicon nitride is removed in order to improve the sensitivity of the solid-state imaging device. FIGS. 1A to 1F are views each illustrating a cross-sectional structure of the solid-state imaging device during a step in the solid-state imaging device production method. The right-hand sides of FIGS. 1A to 1F show a light-receiving region in which photosensitive elements and the like are formed. The left-hand sides of FIGS. 1A to 1F show a peripheral wiring region in which wiring and the like for the solid-state imaging device are formed.

Figure 1A:
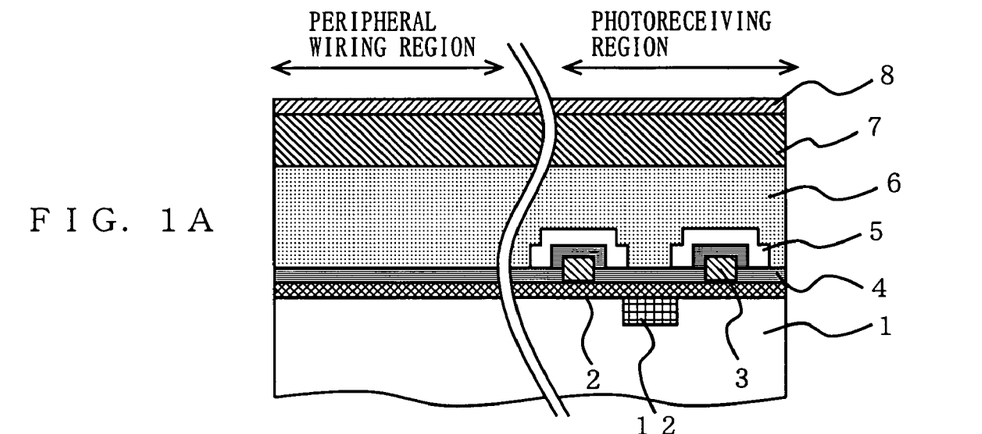
FIGS. 1A, 1B, 1C, 1D, 1E, and 1F are cross-sectional views illustrating steps in a solid-state imaging device production method according to a first embodiment of the present invention.

First, a PD 12 is formed on a silicon substrate 1. After the formation of the PD 12 is completed, a CCD circuit is formed. Hereinafter, the formation of the CCD circuit will be specifically described.

First, on the silicon substrate 1 having the PD 12 formed thereon, agate insulating film 2 (silicon oxide film) is deposited. On the gate insulating film 2, a transfer electrode 3 (e.g., polysilicon) is formed. Next, an insulating film 4 (e.g., a silicon oxide film) is deposited on the transfer electrode 3 and the insulating film 2. Thereafter, a light-shielding film 5 (e.g., W) is formed on the insulating film 4, so as to cover the transfer electrode 3. Thus, the formation of the CCD circuit is completed.

After the formation of the CCD circuit is completed, an insulating film 6 (e.g., a silicon oxide film) is deposited on the interlayer insulating film 4 and the light-shielding film 5. The surface of the insulating film 6 is planarized by a CMP(Chemical Mechanical Polish) technique or the like.

Next, a wiring layer 7 (e.g., Al) having a predetermined film thickness is deposited on the insulating film 6 by a CVD technique, for example. After the deposition of the wiring layer 7 is completed, an insulating film 8 is deposited on the wiring layer 7. An example of the insulating film 8 is a silicon nitride film which is deposited by a plasma CVD technique (hereinafter referred to as a "plasma silicon nitride film"). As a result, the solid-state imaging device acquires a structure as shown in FIG. 1A.

Figure 1B:
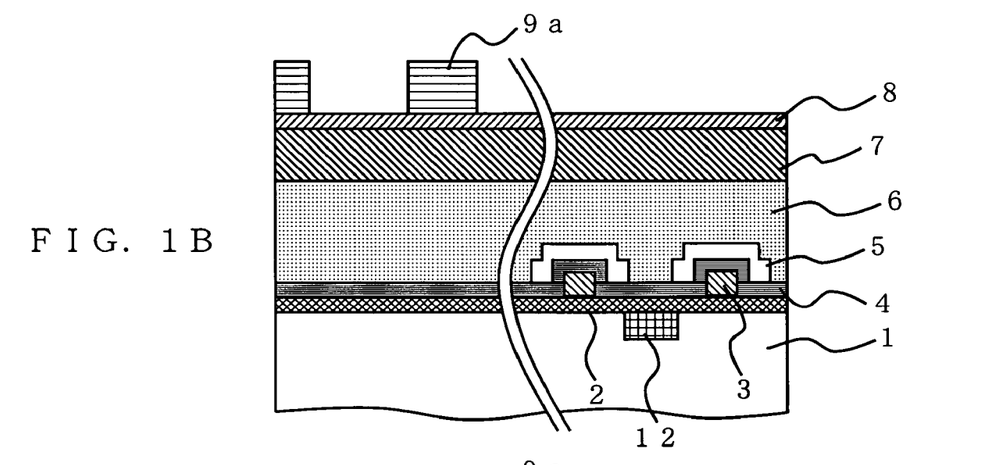
Figure 1C:
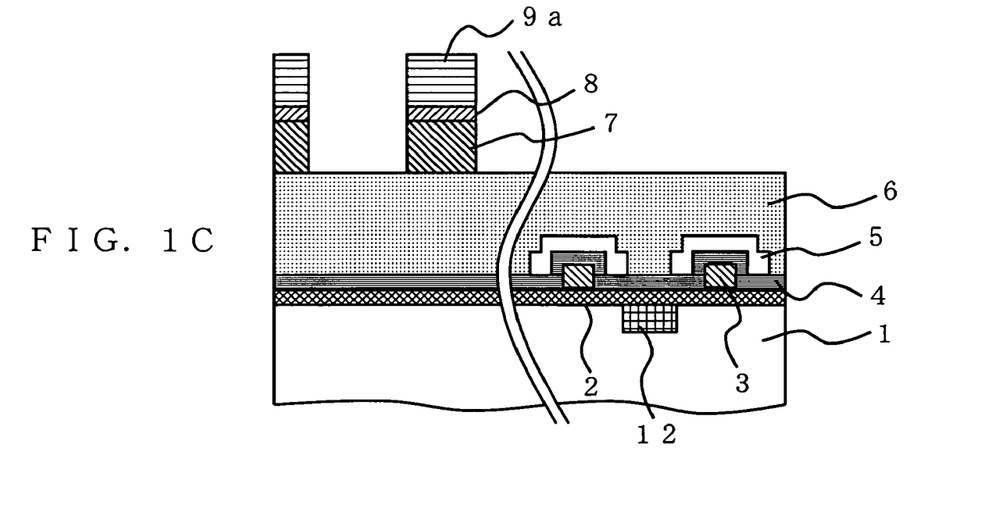

After the deposition of the insulating film 8 is completed, as shown in FIG. 1B, a resist 9a for masking a predetermined region of the insulating film 8 is formed. Thereafter, as shown in FIG. 1C, a dry etching process is performed by using the resist 9a as a mask so as to remove a portion of the insulating film 8 and a portion of the wiring layer 7. Thus, a concurrent patterning of the wiring layer 7 and the insulating film 8 is performed by using the common resist 9a, so that the solid-state imaging device acquires a structure in which an upper face of the wiring layer 7 is covered by the insulating film 8. Thereafter, the resist 9a is removed by an ashing process or the like.

Figure 1D:
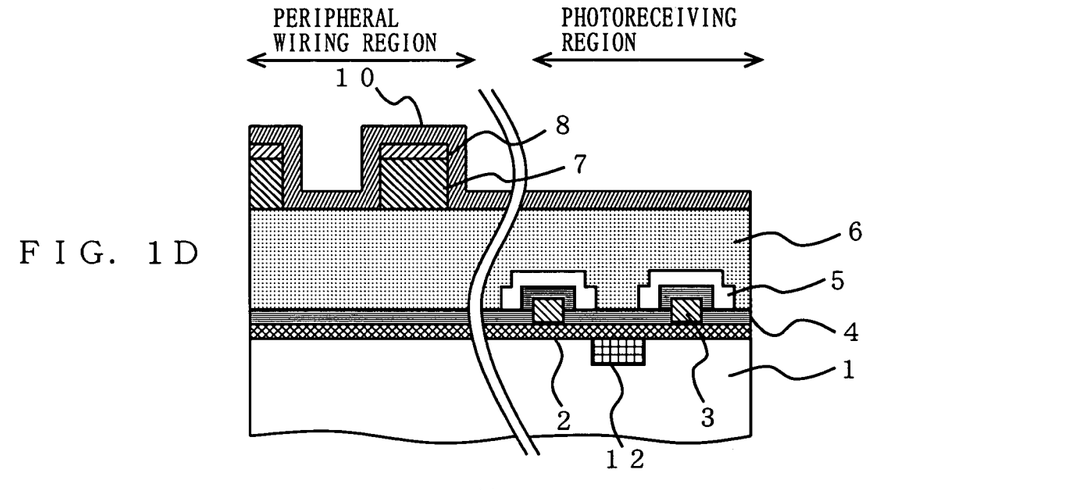

After the removal of the resist 9a is completed, as shown in FIG. 1D, an insulating film 10 containing N—H bonds is deposited on an entire surface of the solid-state imaging device by a plasma CVD technique. An example of the insulating film 10 containing N—H bonds is a plasma silicon nitride film. Thereafter, a heating process is performed for the solid-state imaging device. The heating process causes the hydrogen atoms present within the insulating film 10 to diffuse into the solid-state imaging device and arrive at the interface between the silicon substrate 1 and the gate insulating film 2, so as to be bound to the dangling bonds present in the interface. As a result, the interface state between the silicon substrate 1 and the gate insulating film 2 is reduced, whereby the occurrence of a dark current is suppressed. The heating process is performed by heating the solid-state imaging device at about 300° C. to about 450° C. for several minutes or several hours.

Figure 1E:
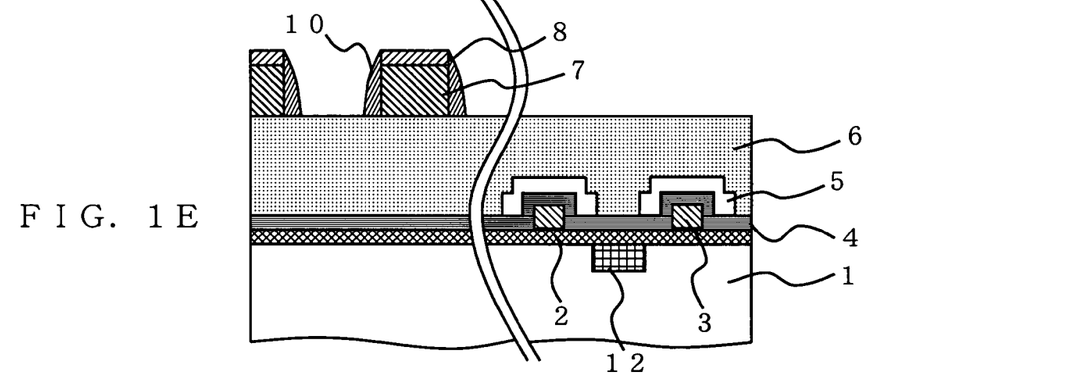

Next, an etch back technique is performed for the entire surface of the solid-state imaging device in order to remove the insulating film 10. Specifically, without providing a mask on the insulating film 10, an anisotropic dry etching process is performed until any insulating film 10 present on the light-receiving region is completely removed. As a result, as shown in FIG. 1E, sidewalls of insulating film 10 are left on both sides of the wiring layer 7, and the insulating film 8 is left upon the wiring layer 7. Therefore, even though the portion of the insulating film 10 which was present on the light-receiving region is completely removed by the dry etching process, the wiring layer 7 is prevented from being directly exposed to the dry etching process, so that the wiring layer 7 will not be damaged from the dry etching process. An etching gas to be used for the dry etching process may be, for example, a fluorocarbon type gas.

Figure 1F:
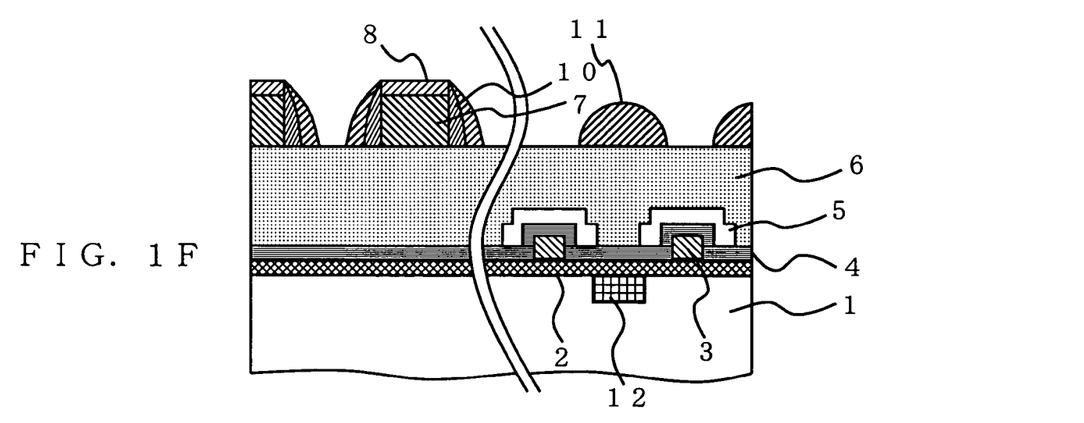

Finally, as shown in FIG. 1F, a microlens 11 is formed on the insulating film 6, vertically above the PD 12 which is formed in the light-receiving region. The microlens 11 is composed of a silicon nitride having a higher optical transmittance than that of the silicon nitride used for the insulating film 10. During the formation of the microlens 11, sidewalls of silicon nitride are formed on both sides of the wiring layer 7.

Thus, according to the solid-state imaging device production method of the present embodiment, an insulating film 8 is present on the wiring layer 7. Therefore, even if any insulating film 10 on the light-receiving region is completely removed, the wiring layer 7 is prevented from being exposed to an etching gas. As a result, the wiring layer 7 is prevented from being damaged during a dry etching process.

Moreover, as shown in FIG. 1C, the insulating film 8 is formed by utilizing the resist 9a, which in itself is used for forming the wiring layer 7. Therefore, as compared to conventional solid-state imaging device production methods, the solid-state imaging device production method according to the present embodiment can reduce the number of times of forming resist films. Specifically, in the conventional solid-state imaging device production method where the wiring layer is protected from an etching process, not only a resist film for forming the wiring layer 7, but also a resist film for protecting the wiring layer 7 needs to be formed, thus resulting in two formations of resist film. On the other hand, according to the present embodiment, the resist film 9a for forming the wiring layer 7 only needs to be formed once. By utilizing this resist 9a, the insulating film 8 for protecting the wiring layer 7 can also be formed. As a result, the number of production steps for the solid-state imaging device can be reduced, thus making it possible to easily produce the solid-state imaging device.

Moreover, according to the solid-state imaging device production method of the present embodiment, a heating process is performed after providing the insulating film 10 containing plenty of N—H bonds. Therefore, the interface state within the solid-state imaging device can be reduced. As a result, the occurrence of a dark current in the solid-state imaging device can be suppressed.

Moreover, according to the solid-state imaging device production method of the present embodiment, the insulating film 10 having a high optical absorption rate is removed so that it is possible to increase the amount of light entering the PD 12. Furthermore, since the insulating film 10 is thus removed, the microlens 11 can be formed closer to the PD 12. As a result, light can be collected by the PD 12 more efficiently, thereby improving the sensitivity of the solid-state imaging device.

Note that the microlens 11 does not need to be provided. However, the microlens 11 will contribute to an improved sensitivity of the solid-state imaging device as compared to the case where the microlens 11 is not provided.

Although the present embodiment illustrates a case of reducing an interface state occurring at the interface between the silicon substrate 1 and the gate insulating film 2, the site for reducing an interface state is not limited thereto. According to the solid-state imaging device production method of the present embodiment, an interface state occurring at any other interface within the solid-state imaging device can also be reduced.

(Second Embodiment)

Next, a solid-state imaging device production method according to a second embodiment of the present invention will be described. The solid-state imaging device production method according to the present embodiment differs from the solid-state imaging device production method according to the first embodiment with respect to the patterning procedure for the wiring layer 7 and the insulating film 8. Specifically, in the first embodiment, as shown in FIG. 1C, the wiring layer 7 and the insulating film 8 are patterned through a single step of dry etching process using the resist 9a as a mask. On the other hand, in the present embodiment, the wiring layer 7 and the insulating film 8 are patterned through the two steps illustrated in FIG. 2C and FIG. 2D. The second embodiment is similar to the first embodiment except for the patterning steps of the wiring layer 7 and the insulating film 8. Hereinafter, the solid-state imaging device production method according to the present embodiment will be described with reference to the figures.

First, a PD 12 is formed on a silicon substrate 1. After the formation of the PD 12 is completed, a CCD circuit is formed. Since this process is similar to that in the first embodiment, any more detailed description thereof is omitted.

After the formation of the CCD circuit is completed, an insulating film 6 is deposited on an interlayer insulating film 4 and a light-shielding film 5. Since this process is similar to that in the first embodiment, any more detailed description thereof is omitted.

Figure 2A:
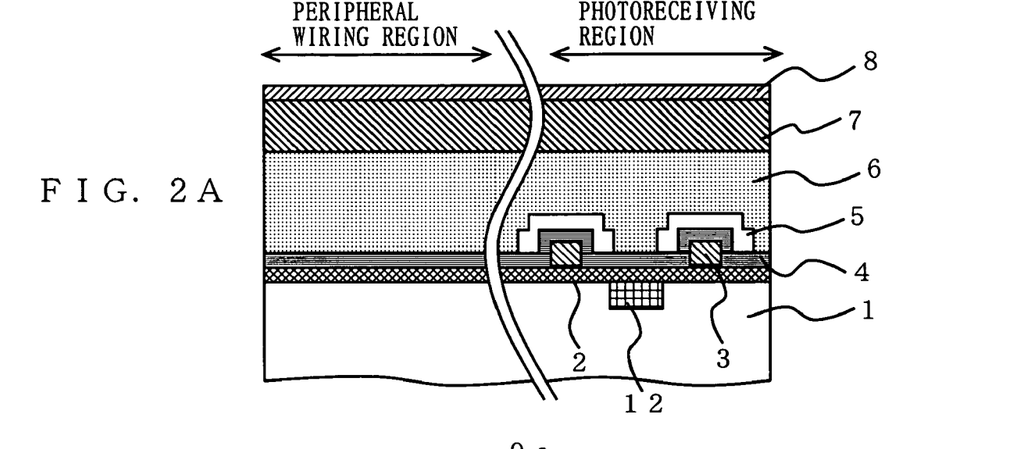
FIGS. 2A, 2B, 2C, 2D, 2E, 2F, and 2G are cross-sectional views illustrating steps in a solid-state imaging device production method according to a second embodiment of the present invention.

Next, a wiring layer 7 having a predetermined film thickness is deposited on the insulating film 6 by a CVD technique, for example. After the deposition of the wiring layer 7 is completed, an insulating film 8 is deposited on the wiring layer 7. Since this process is similar to that in the first embodiment, any more detailed description thereof is omitted. Thus, the solid-state imaging device acquires a structure as shown in FIG. 2A.

Figure 2B:
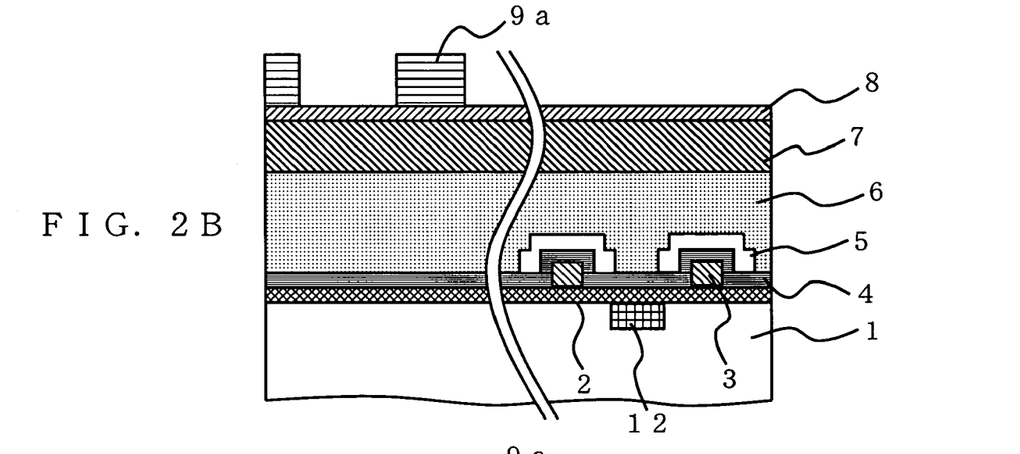
Figure 2C:
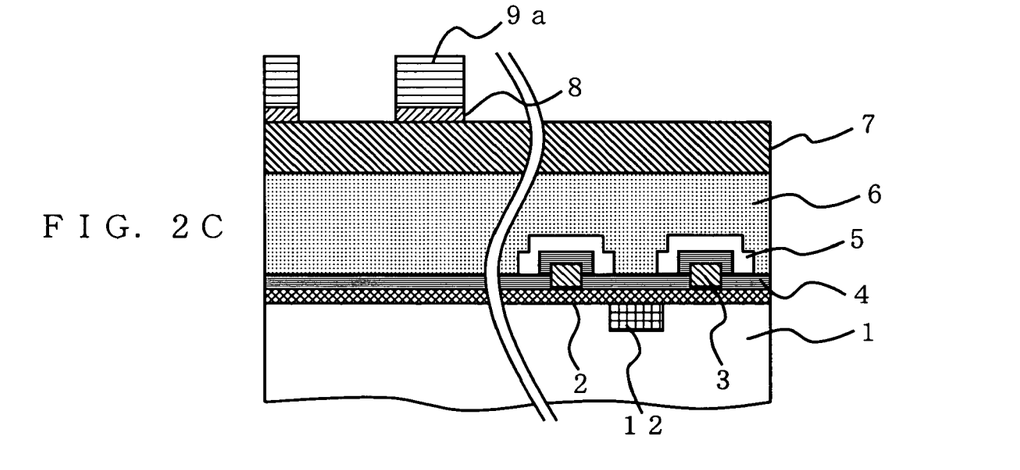

After the deposition of the insulating film 8 is completed, as shown in FIG. 2B, a resist 9a is formed on a predetermined region of the insulating film 8. Thereafter, as shown in FIG. 2C, a dry etching process is performed by using the resist 9a as a mask so a store move the insulating film 8. Thereafter, the resist 9a is removed by an ashing process or the like.

Figure 2D:
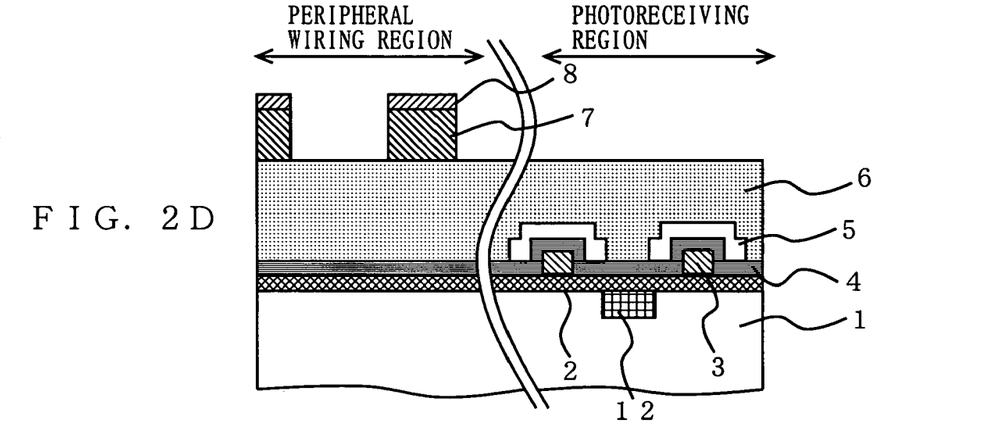

After the removal of the resist 9a is completed, as shown in FIG. 2D, a dry etching process is performed by using the insulating film 8 as a mask, in order to remove any region of the wiring layer 7 on which the insulating film 8 is not deposited. Thus, the patternings for the wiring layer 7 and the insulating film 8 protecting the upper face of the wiring layer 7 are completed.

Figure 2E:
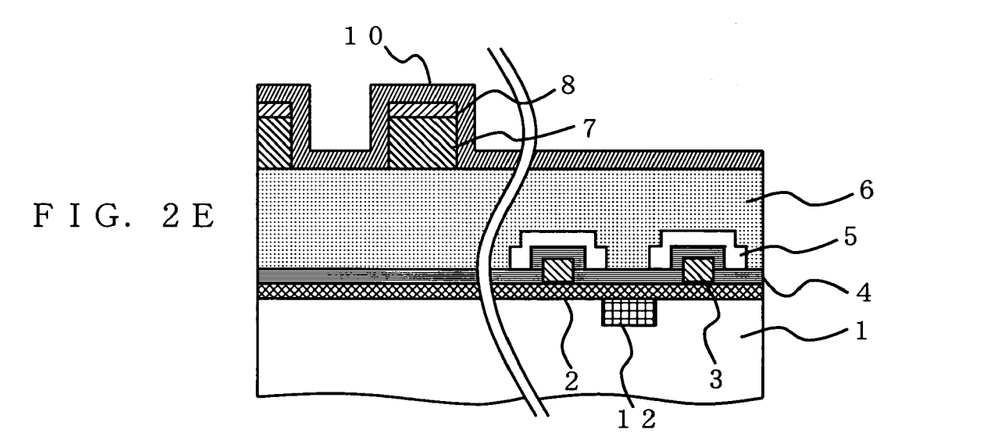
Figure 2F:
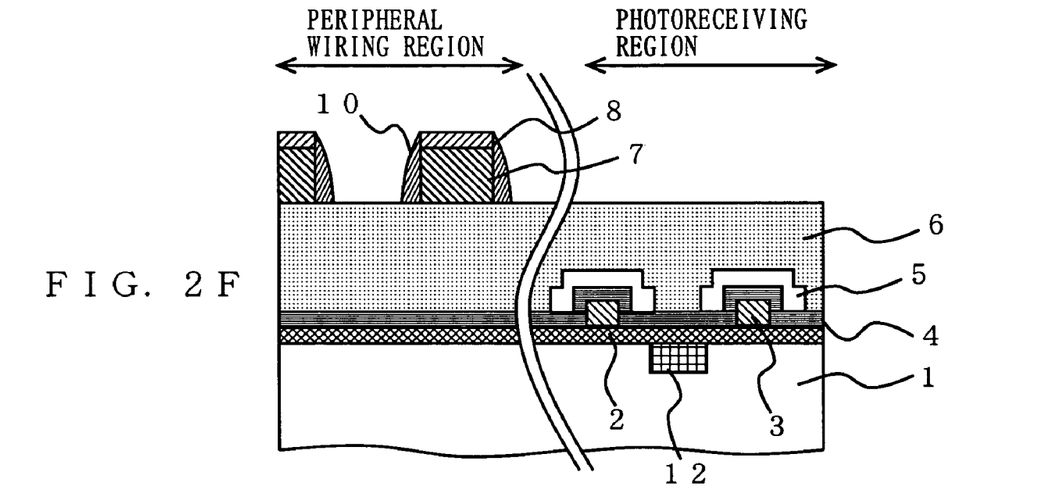
Figure 2G:
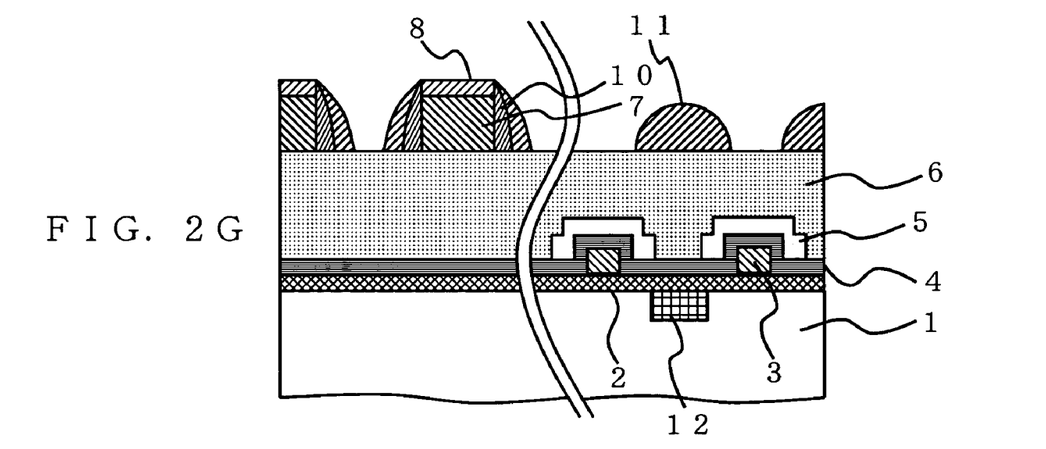

The steps illustrated in FIG. 2E, FIG. 2F, and FIG. 2G are similar to the steps in the first embodiment illustrated in FIG. 1D to FIG. 1F, and the descriptions thereof are omitted.

As described above, according to the solid-state imaging device production method of the present embodiment, the wiring layer 7 and the insulating film 8 are removed in separate steps. Therefore, it is possible to perform an etching process under optimum conditions for each film, so that each film can be patterned with a high precision. As a result, highly precise wiring can be formed.

Moreover, according to the solid-state imaging device production method of the present embodiment, the occurrence of a dark current in the solid-state imaging device can be suppressed, as in the case with the first embodiment. Moreover, as in the case of the first embodiment, the wiring layer 7 is prevented from being damaged from a dry etching process. Furthermore, as in the case of the first embodiment, it is not necessary to form a further resist film for protecting the wiring layer 7, so that the number of production steps for the solid-state imaging device can be reduced. Furthermore, as in the case of the first embodiment, light can be collected by the PD 12 efficiently, thus improving the sensitivity of the solid-state imaging device.

The first embodiment and the second embodiment illustrate examples where, after a heating process is performed for the insulating film 10, the insulating film 10 is removed by an etch back technique without providing a mask (FIG. 1E and FIG. 2F). Alternatively, it is also applicable to provide a mask for portions where it is desirable to leave the insulating film 10. Such a variant will be described with reference to FIGS. 3A to 3C.

Figure 3A:
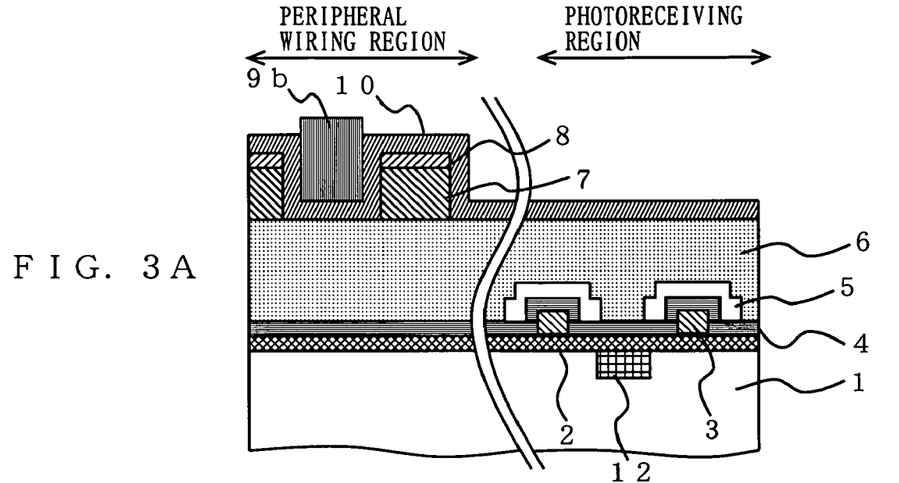
FIGS. 3A, 3B, and 3C are cross-sectional views illustrating steps in a variant of a solid-state imaging device production method according to the present invention.
Figure 3B:
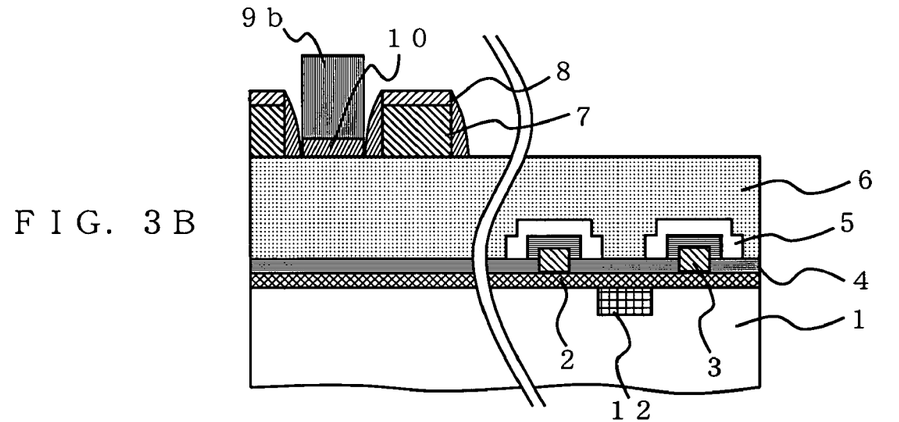

After a heating process is performed for the insulating film 10 (FIG. 1D or FIG. 2E) in the first embodiment or the second embodiment, as shown in FIG. 3A, a resist 9b is formed between the wiring layer 7 and a wiring layer adjoining the wiring layer 7. Then, as shown in FIG. 3B, an etching process is performed by using the resist 9b as a mask in order to remove the insulating film 10 which has been deposited on the insulating film 6. Any insulating film 10 present below the resist 9b is not removed, but remains on the insulating film 6. Thereafter, the resist 9b is removed by an ashing process or the like.

Figure 3C:
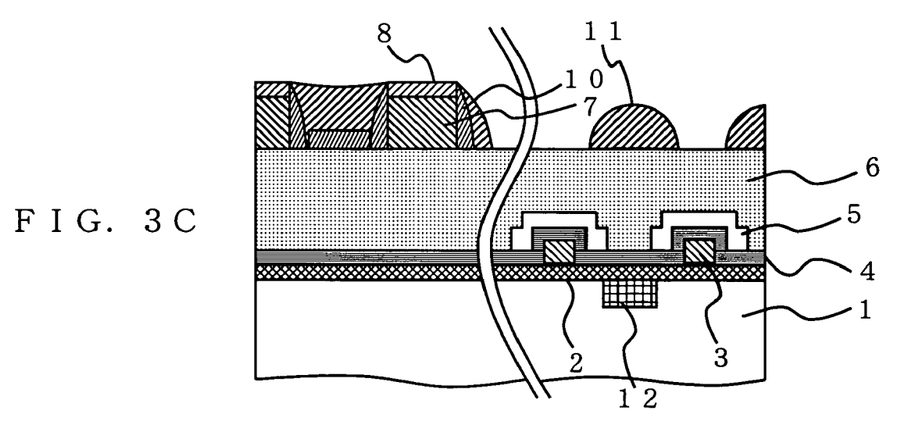

After the removal of the resist 9b is completed, as in the above embodiments, as shown in FIG. 3C, a microlens 11 is formed on the insulating film 6. At this time, an insulating film composed of the same materials as that of the microlens 11 is formed on the remaining portion of the insulating film 10 which was not removed, so as to fill in the gap between the wiring layers. By thus filling in the gap between wiring layers with the insulating film, it becomes possible to eliminate a level difference between the wiring layers. This can facilitate the processes to be performed in the subsequent steps, such as application of a resist on the wiring layer, patterning thereof, and the like. However, in the case where the solid-state imaging device is produced by the method illustrated in FIGS. 3A to 3C, the number of production steps is increased because of the step of forming the resist 9b.

Although the first and second embodiments illustrate examples where the insulating film 8 as a protection film is formed above the wiring layer 7, the place for forming the insulating film 8 is not limited to above the wiring layer 7. In a third embodiment described below, a solid-state imaging device production method will be described in which the insulating film 8 is formed also in portions other than above the wiring layer 7.

(Third Embodiment)

Hereinafter, a solid-state imaging device production method according to a third embodiment of the present invention will be described with reference to the figures. As opposed to the first embodiment where the insulating film 8 as a protection film is formed only above the wiring layer 7, the solid-state imaging device production method of the present embodiment differs in that an insulating film is formed not only above the wiring layer 7, but over the entire light-receiving region and peripheral wiring region. Otherwise, the present embodiment is similar to the first embodiment. FIGS. 4A to 4G are views each illustrating a cross-sectional structure of the solid-state imaging device during a step in the solid-state imaging device production method according to the present embodiment. The right-hand sides of FIG. 4A to FIG. 4G show a light-receiving region in which photosensitive elements and the like are formed. The left-hand sides of FIG. 4A to FIG. 4G show a peripheral wiring region in which wiring and the like for the solid-state imaging device are formed.

First, a PD 12 is formed on a silicon substrate 1. After the formation of the PD 12 is completed, a CCD circuit is formed. Since this process is similar to that in the first embodiment, any more detailed description thereof is omitted.

After the formation of the CCD circuit is completed, an insulating film 6 is deposited on an interlayer insulating film 4 and a light-shielding film 5. Since this process is similar to that in the first embodiment, any more detailed description thereof is omitted.

Figure 4A:
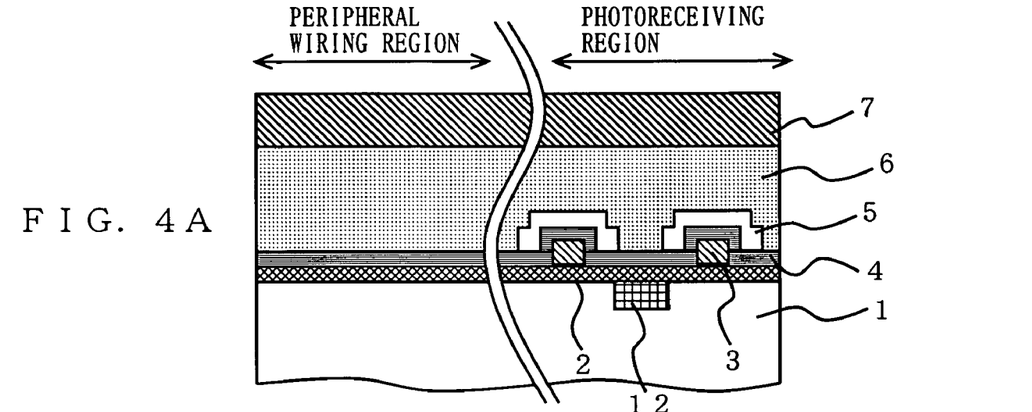
FIGS. 4A, 4B, 4C, 4D, 4E, 4F, and 4G are cross-sectional views illustrating steps in a solid-state imaging device production method according to a third embodiment of the present invention.

Next, a wiring layer 7 having a predetermined film thickness is deposited on the insulating film 6 by a CVD technique, for example. Since this process is similar to that in the first embodiment, any more detailed description thereof is omitted. Thus, the solid-state imaging device acquires a structure as shown in FIG. 4A.

Figure 4B:
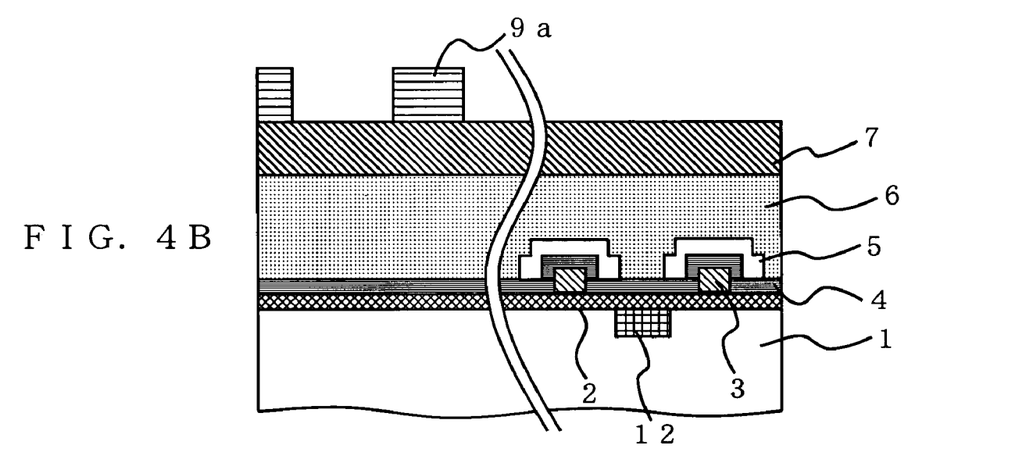
Figure 4C:
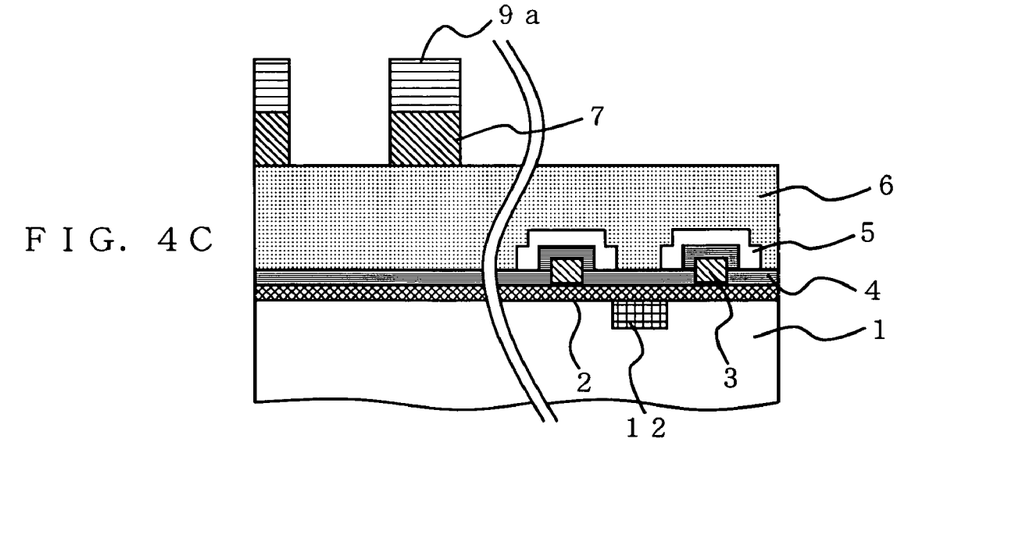

After the deposition of the wiring film 7 is completed, as shown in FIG. 4B, a resist 9a is formed on a predetermined region of the wiring film 7. Thereafter, as shown in FIG. 4C, a dry etching process is performed by using the resist 9a as a mask so as to remove the unmasked portion of the wiring film 7. Thereafter, the resist 9a is removed by an ashing process or the like.

Figure 4D:
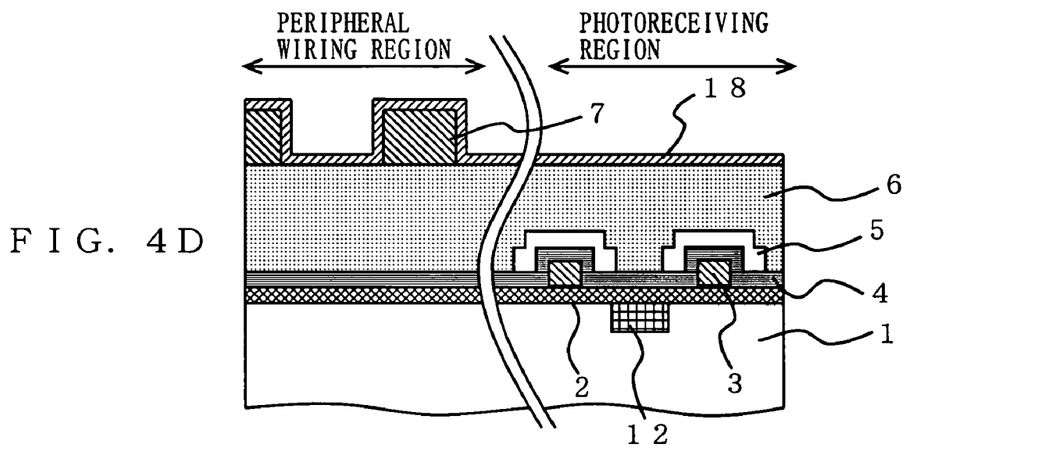
Figure 4E:
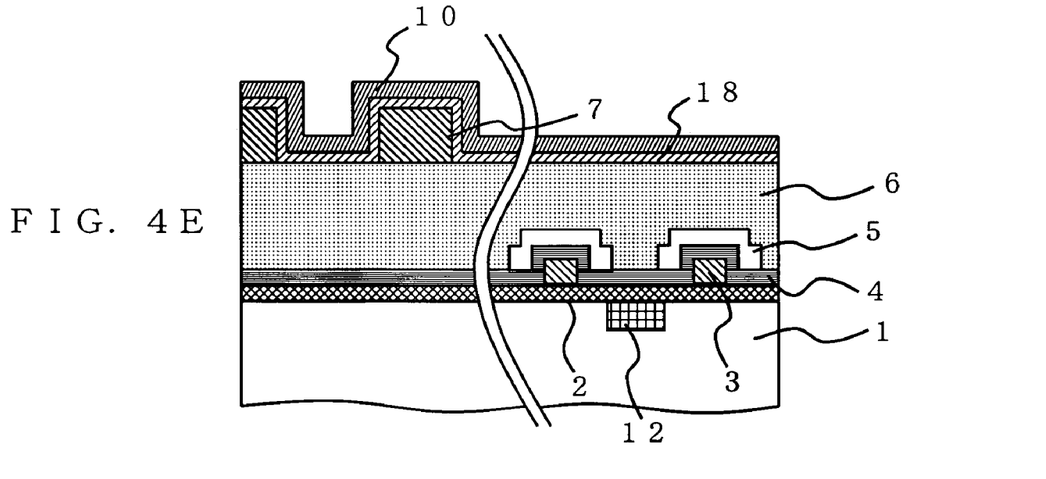

After the removal of the resist 9a is completed, as shown in FIG. 4D, an insulating film 18 is deposited on the entire surface of the wiring layer 7 and the insulating film 6. After the deposition of the insulating film 18 is completed, as shown in FIG. 4E, an insulating film 10 of plasma silicon nitride is deposited on the insulating film 18 by a plasma CVD technique. In the first embodiment, the insulating film 10 is deposited after removing the insulating film 8 except immediately above the wiring layer 7. In contrast, in the present embodiment, the insulating film 10 is deposited without removing any portion of the insulating film 18. Therefore, according to the present embodiment, the insulating film 18 is also left in the light-receiving region. Hence, whereas the material of the insulating film 8 in the first embodiment may be those which have low optical transmittance so long as it is capable of protecting the wiring layer 7, e.g., plasma silicon nitride, the material of the insulating film 18 according to the present embodiment should not impede light transmission in the light-receiving region. Such a material for the insulating film 18 at least has a higher optical transmittance than that of the plasma silicon nitride composing the insulating film 10, e.g., silicon oxide.

After the deposition of the insulating film 10 is completed, a heating process is performed for the insulating film 10 in order to reduce the interface state occurring in the solid-state imaging device. The heating process has been described in the first embodiment, and any more detailed description thereof is omitted.

Figure 4F:
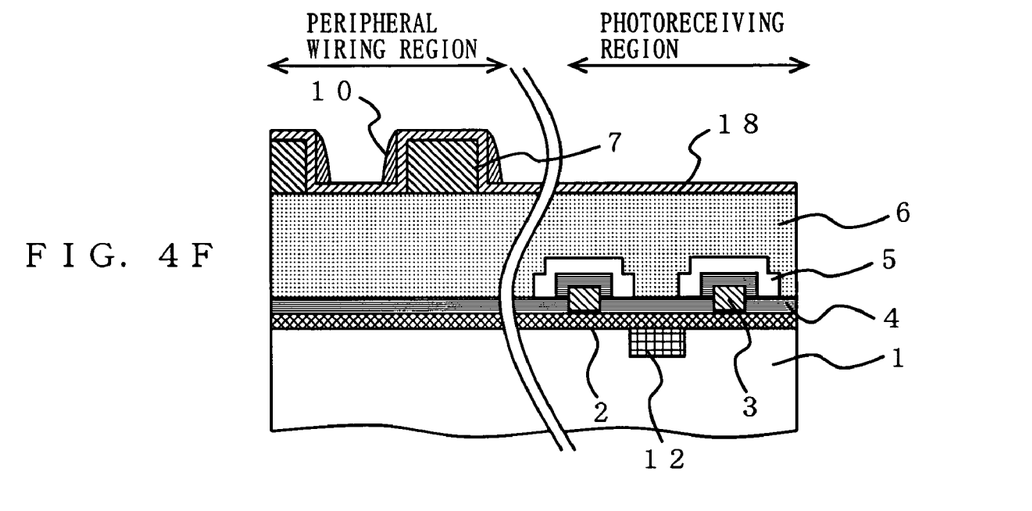

After the heating process is completed, an etch back technique is performed for the entire surface of the solid-state imaging device in order to remove the insulating film 10. Specifically, without providing a mask on the insulating film 10, an anisotropic dry etching process is performed until any insulating film 10 present on the light-receiving region is completely removed. As a result, as shown in FIG. 4F, the insulating film 18 is exposed, and sidewalls of insulating film 10 are left on both sides of the wiring layer 7. Therefore, as in the case of the first embodiment, the upper face of the wiring layer 7 is protected by the insulating film 18, and both sides of the wiring layer 7 are protected by the sidewalls of insulating film 10 and insulating film 18. As a result, as in the case of the first embodiment, the wiring layer 7 will not be directly exposed during the dry etching process.

Figure 4G:
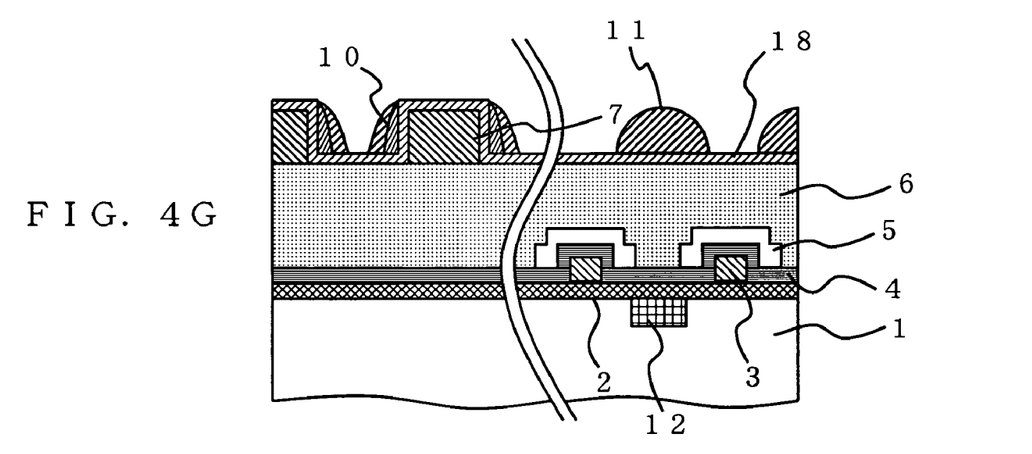

Finally, as shown in FIG. 4G, a microlens 11 is formed on the insulating film 6, vertically above the PD 12 which is formed in the light-receiving region. Since this process is similar to that in the first embodiment, detailed description thereof is omitted.

As described above, according to the solid-state imaging device production method of the present embodiment, the insulating film 18 is deposited to the same film thickness in both the peripheral wiring region and the light-receiving region. Thus, the level difference between the peripheral wiring region and the light-receiving region can be minimized. Specifically, in conventional techniques, a mask is formed only in the peripheral wiring region during the process of etching away the insulating film 10, so that the insulating film 10 in the peripheral wiring region will remain without being removed, while the insulating film 10 in the light-receiving region will be removed. As a result, between the light-receiving region and the wiring portion of the peripheral wiring region, a level difference will emerge which is equal to a total of the wiring height and the film thickness of the insulating film 10. Such a level difference hinders application of a resist on the wiring region, or patterning thereof.

In contrast, according to the present embodiment, the insulating film 18 is formed in both the peripheral wiring region and the light-receiving region, so that only a level difference due to the wiring emerges between the peripheral wiring region and the light-receiving region. This can facilitate, for example, application of a resist on the wiring layer, patterning thereof, and the like.

Moreover, according to the solid-state imaging device production method of the present embodiment, the occurrence of a dark current in the solid-state imaging device can be suppressed. Moreover, as in the case of the first embodiment, the wiring layer 7 is prevented from being damaged from the dry etching process.

Moreover, in a solid-state imaging device which has been produced by the solid-state imaging device production method of the present embodiment, a material having a higher optical transmittance than that of the plasma silicon nitride film is used for the insulating film 18 present between the microlens 11 and the insulating film 6, so that the reduction in the amount of light entering the PD 12 is negligible. As a result, as compared with a solid-state imaging device produced by the conventional solid-state imaging device production method, light can be collected by the PD 12 more efficiently, whereby the sensitivity of the solid-state imaging device can be improved.

Furthermore, the insulating film 18 for protecting the wiring layer 7 is not etched away by using a resist film. Therefore, the process of forming a resist film for etching away the insulating film 10, which was a problem in the conventional technique, is not necessary. As a result, according to the solid-state imaging device production method of the present embodiment, as in the case of the first embodiment, the number of production steps for the solid-state imaging device can be reduced.

In the solid-state imaging device production method of the present embodiment, too, a portion of the insulating film 10 may be left between wiring layers 7, as was described at the end of the second embodiment with reference to FIGS. 3A to 3C.

Figure 5A:
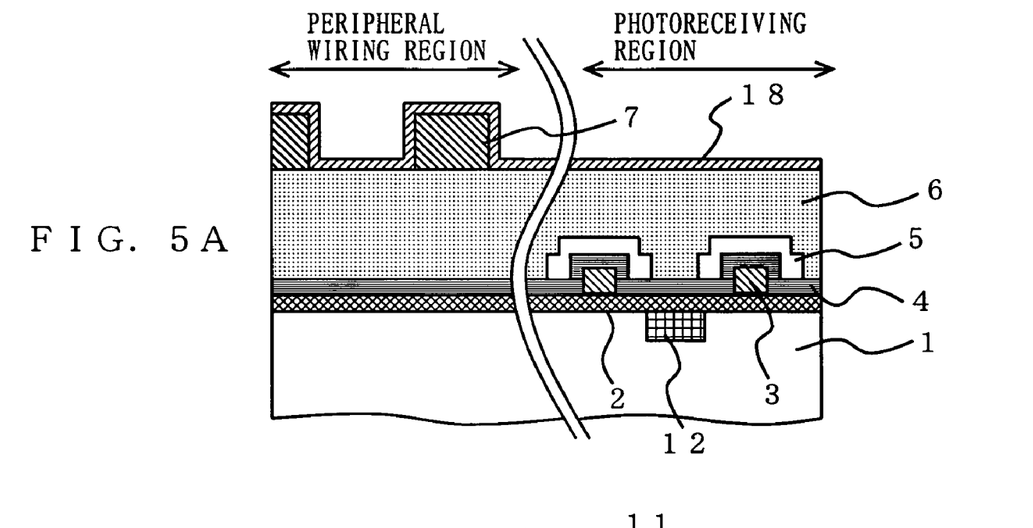
FIGS. 5A and 5B are cross-sectional views illustrating steps in a variant of a solid-state imaging device production method according to a third embodiment of the present invention.
Figure 5B:
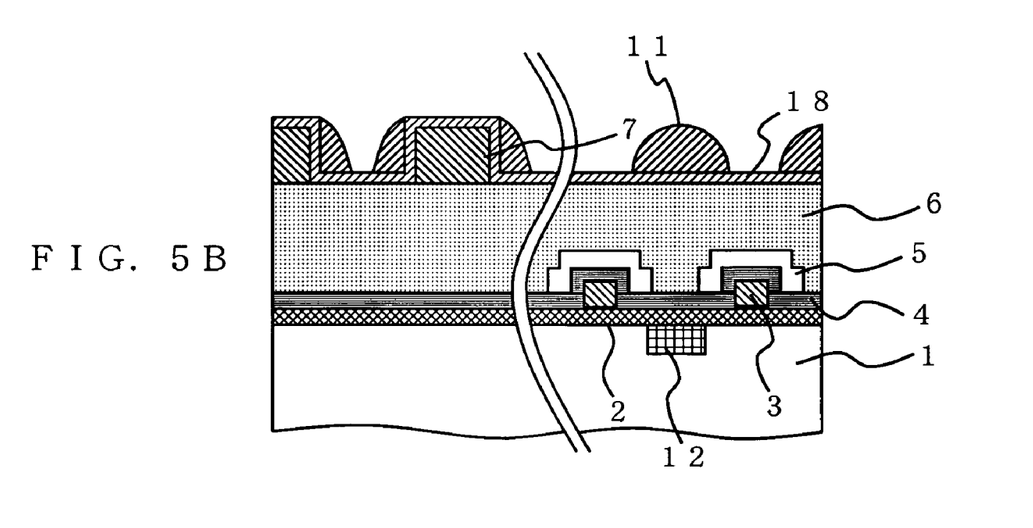

Although the solid-state imaging device production method according to the present embodiment removes the insulating film 10 by an anisotropic dry etching process, the insulating film 10 may alternatively be removed by an isotropic wet etching process. Hereinafter, with reference to the figures, a variant of the solid-state imaging device production method where the insulating film 10 is removed by an isotropic wet etching process will be described. This solid-state imaging device production method is identical to the third embodiment except that the insulating film 10 is removed by a wet etching process instead of a dry etching process. FIGS. 5A and 5B are cross-sectional views of the semiconductor device illustrating steps in this solid-state imaging device production method. The right-hand sides of FIGS. 5A and 5B show a light-receiving region in which photosensitive elements and the like are formed. The left-hand sides of FIGS. 5A and 5B show a peripheral wiring region in which wiring and the like for the solid-state imaging device are formed.

The processes to be performed in FIGS. 4A to 4C and in FIG. 4D and FIG. 4E are identical to those in the third embodiment, and the descriptions thereof are omitted.

In FIG. 4E, after a heating process is completed, an isotropic wet etching process is performed for the insulating film 10. As a result, as shown in FIG. 5A, the insulating film 10 is completely removed, and the insulating film 18 is exposed. Thus, since the insulating film 18 covers the entire solid-state imaging device, the upper face and both side faces of the wiring layer 7 can be protected even after the insulating film 10 deposited thereon is completely removed through the isotropic wet etching process. As a result, the wiring layer 7 is not exposed to the etching process.

After the isotropic wet etching process is completed, as shown in FIG. 5B, a microlens 11 is formed. Since this process is similar to that in the first embodiment, any more detailed description thereof is omitted.

The first to third embodiments illustrates examples where the insulating film 10 is a plasma silicon nitride film, the insulating film 10 is not limited to a plasma silicon nitride film. The insulating film 10 may be any insulating film containing N—H bonds, e.g., a silicon oxide/nitride film or a silicon oxide film produced by a plasma CVD technique. However, a plasma silicon nitride film is most effective for suppressing the occurrence of a dark current.

While the invention has been described in detail, the foregoing description is in all aspects illustrative and not restrictive. It is understood that numerous other modifications and variations can be devised without departing from the scope of the invention.

What is claimed is:

1. A method for producing a solid-state imaging device comprising the steps of:
   forming a light-receiving section on a semiconductor substrate;
   forming a first insulating film on the light-receiving section and the semiconductor substrate;
   forming a metal film for wiring on the first insulating film;
   forming a protection film on the metal film;
   forming a resist film on a predetermined region of the protection film;
   removing a portion of the protection film and a portion of the metal film by using the resist film to form a wire whose upper face is covered by the protection film;
   forming a hydrogen-containing second insulating film on the wire and the first insulating film;
   performing a heating process for the second insulating film; and
   performing an anisotropic etching process for an entire surface of the second insulating film to remove the second insulating film.

2. The solid-state imaging device production method according to claim 1, wherein
   the step of forming the wire comprises the steps of:
   etching away the metal film and the protection film by using the resist film as a mask; and
   removing the resist film.

3. The solid-state imaging device production method according to claim 1, wherein
   the step of forming the wire comprises the steps of:
   etching away the protection film by using the resist film as a mask;
   removing the resist film; and
   etching away the metal film by using the protection film as a mask.

4. The solid-state imaging device production method according to claim 1, further comprising a step of, after etching away the second insulating film, forming a lens on the first insulating film for collecting light to the light-receiving section.

5. The solid-state imaging device production method according to claim 1, further comprising, after the heating process, forming a resist film between said wires,
   wherein the step of removing the second insulating film comprises performing an anisotropic etching process using the resist film formed between the wires as a mask, and further comprising a step of depositing an insulating film between the wires.

6. The solid-state imaging device production method according to claim 1, wherein the second insulating film is a silicon nitride film formed by a plasma CVD technique.

7. A method for producing a solid-state imaging device comprising the steps of:
   forming a light-receiving section on a semiconductor substrate;
   forming a first insulating film on the light-receiving section and the semiconductor substrate;
   forming a wire on the first insulating film;
   forming a protection film on the wire and the first insulating film;
   forming a hydrogen-containing second insulating film on the protection film;
   performing a heating process for the second insulating film; and
   performing an etching process to remove the second insulating film,
   wherein the protection film has a higher optical transmittance than that of the second insulating film.

8. The solid-state imaging device production method according to claim 7, wherein the etching process is an anisotropic etching process.

9. The solid-state imaging device production method according to claim 7, wherein the etching process is an isotropic etching process.

10. A solid-state imaging device having a light-receiving section formed on a semiconductor substrate, comprising:
    a first insulating film formed on the semiconductor substrate and the light-receiving section;
    a wire formed on the first insulating film;
    a protection film for protecting at least an upper face of the wire; and
    sidewalls for protecting both sides of the wire, the sidewalls being formed of an insulative material containing hydrogen,
    wherein the protection film is formed on the wire and the first insulating film, and has a higher optical transmittance than that of the first insulating film.

11. The solid-state imaging device according to claim 10, further comprising a microlens formed in the light-receiving section region.

12. The solid-state imaging device according to claim 11, wherein the protection film is made of a same material as the microlens.

13. The solid-state imaging device according to claim 10, wherein the first insulating film is a silicon oxide film, and the protection film is a silicon nitride film.

* * * * *